United States Patent
Miyamoto

(10) Patent No.: US 11,327,590 B2
(45) Date of Patent: May 10, 2022

(54) TOUCH SENSOR AND DISPLAY DEVICE HAVING A TOUCH SENSOR

(71) Applicant: Japan Display Inc., Tokyo (JP)

(72) Inventor: Mitsuhide Miyamoto, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 17/029,502

(22) Filed: Sep. 23, 2020

(65) Prior Publication Data

US 2021/0004112 A1    Jan. 7, 2021

Related U.S. Application Data

(63) Continuation of application No. PCT/JP2019/004083, filed on Feb. 5, 2019.

(30) Foreign Application Priority Data

Mar. 27, 2018 (JP) .............................. JP2018-060420

(51) Int. Cl.
*G06F 3/041* (2006.01)
*G06F 3/044* (2006.01)
*G06F 3/147* (2006.01)

(52) U.S. Cl.
CPC .......... *G06F 3/0412* (2013.01); *G06F 3/0445* (2019.05); *G06F 3/1475* (2013.01)

(58) Field of Classification Search
CPC .... G06F 3/0412; G06F 3/0445; G06F 3/1475; G06F 3/04164; G06F 3/0448; G06F 2203/04112; G06F 3/0443; G06F 3/0446; H01L 27/323; H01L 27/32

See application file for complete search history.

(56) References Cited

U.S. PATENT DOCUMENTS

| | | | |
|---|---|---|---|
| 10,915,190 B2* | 2/2021 | Gong | G06F 3/0443 |
| 2017/0185224 A1 | 6/2017 | Nagata et al. | |
| 2017/0212615 A1* | 7/2017 | Watanabe | G06F 3/0488 |
| 2018/0321708 A1* | 11/2018 | Wu | G06F 3/0443 |
| 2019/0204974 A1 | 7/2019 | Gong | |
| 2021/0124457 A1 | 4/2021 | Gong | |

FOREIGN PATENT DOCUMENTS

| | | |
|---|---|---|
| WO | 2015/182473 A1 | 12/2015 |
| WO | 2019/033833 A1 | 2/2019 |

OTHER PUBLICATIONS

International Search Report dated Apr. 16, 2019 for the PCT application No. PCT/JP2019/004083, with English translation.
Office Action dated Feb. 8, 2022 for Japanese Application No. 2018-060420, with English translation.

* cited by examiner

*Primary Examiner* — Sahlu Okebato
(74) *Attorney, Agent, or Firm* — Michael Best & Friedrich LLP

(57) ABSTRACT

The touch sensor includes a touch detection area with at least a part of a curved area having a curved edge. In the touch detection area, a plurality of first electrodes and second electrodes disposed side by side in a first direction and in a second direction are disposed. A plurality of first electrodes disposed side by side in the first direction are connected to each other. A plurality of second electrodes disposed side by side in the second direction are connected to each other. In the curved area, distances between the plurality of first electrodes and the second electrodes in the first direction gradually change in the second direction.

18 Claims, 8 Drawing Sheets

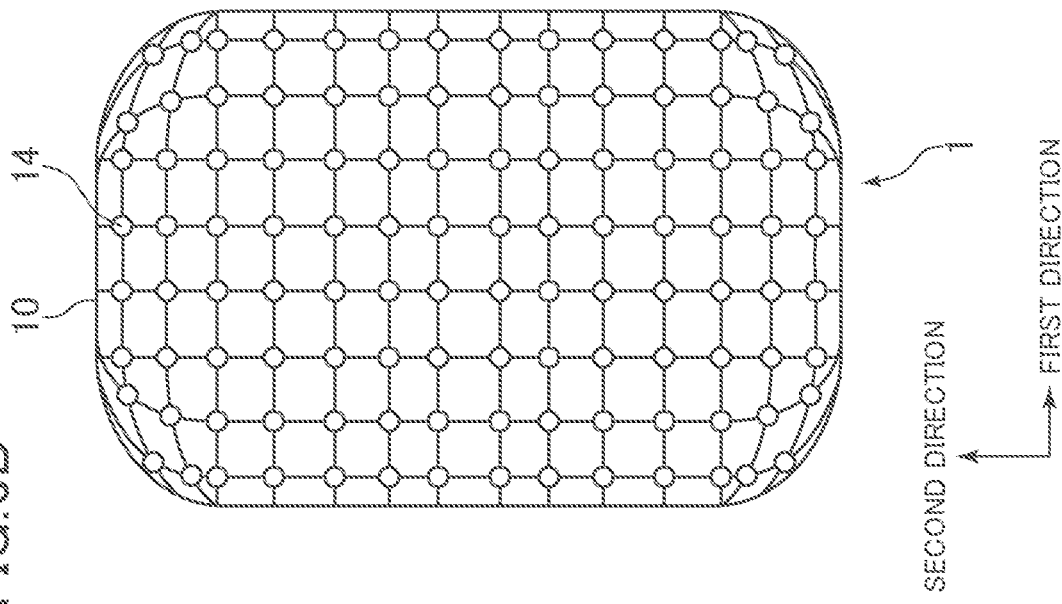
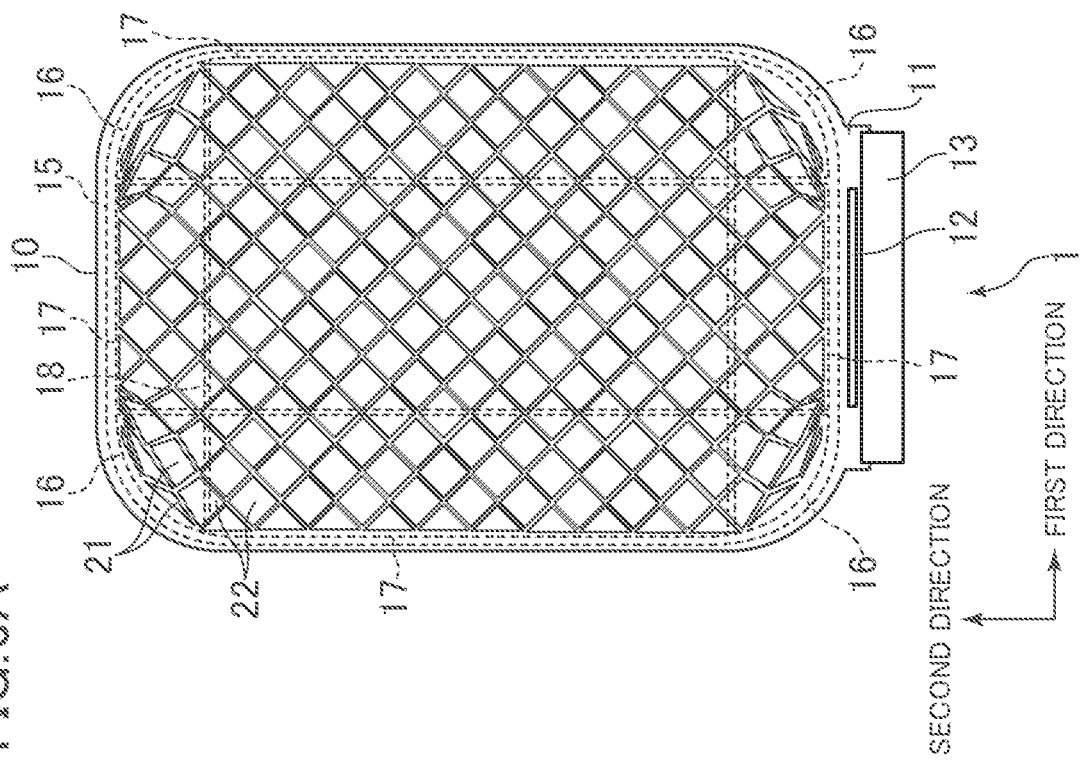

TOUCH SENSOR AND DISPLAY DEVICE HAVING A TOUCH SENSOR

CROSS-REFERENCE TO RELATED APPLICATION

The present application is Bypass Continuation or International Application No. PCT/JP2019/004083, filed on Feb. 5, 2019, which claims priority from. Japanese Application No. JP2018-06420 filed on Mar. 27, 2018. The contents of these applications are hereby incorporated by reference into this application.

BACKGROUND OF THE INVENTION

1. Field of the Invention

The present invention relates to a touch sensor and a display device having a touch sensor.

2. Description of the Related Art

As shown in FIG. 8, International Publication No. 2015/182473 discloses a touch panel device including: an electrode extending in a lateral direction in which electrodes adjacent to each other are connected to each other via a connection unit; an electrode extending in a longitudinal direction in which the electrodes adjacent to each other are connected to each other via the connection unit; a voltage application unit 110, and a charge detection unit 100. The touch panel device detects a position touched by a finger or the like that approaches an electrode extending in the longitudinal direction, based on a change in the amount of electric charges detected by the charge detection unit 100.

Further, International Publication No. 2015/182473 discloses that an edge of a corner portion is curved. The electrode includes a rectangular reference electrode pair disposed in the vicinity of the center and a deformed electrode pair disposed in the vicinity of the curved edge and having a shape in which a part of the rectangle is missing. It is disclosed that the touch panel 1' device has a correction unit that amplifies the output of the deformed electrode pair to the same level as that of the output of the reference electrode pair.

SUMMARY OF THE INVENTION

In the above-described configuration n the related art, only the electrodes disposed at the edge of the touch panel device have a shape different from that of the electrodes disposed at the center, and the reference electrode pair electrically connected to the deformed electrode pair and the reference electrode pair that is not connected to the deformed electrode pair are mixed. Therefore, even when the correction unit amplifies the output of the electrode including the deformed electrode pair of the charge detection unit 100, the output of the reference electrode pair connected to the deformed electrode pair is also amplified, and thus, it was not possible to correct the touched coordinate with high accuracy.

An object of the present invention is to provide a touch sensor having a curved edge and a display device having a touch sensor, that is, a touch sensor having improved detection accuracy of the touched coordinates and a display device having a touch sensor.

According to one aspect of the present invention, there is provided a touch sensor. The touch sensor includes a touch detection area with at least a part of a curved area having a curved edge. In the touch detection area, a plurality of first electrodes and second electrodes disposed side by side in a first direction and in a second direction are disposed. A plurality of first electrodes disposed side by side in the first direction are connected to each other. A plurality of second electrodes disposed side by side in the second direction are connected to each other. In the curved area, distances between the plurality of first electrodes and the second electrodes in the first direction gradually change in the second direction.

According to another aspect of the present invention, there is provided a display device having a touch sensor. The display device includes a display unit in which a light emitting element and a plurality of pixels having transistors are disposed in a matrix shape, a touch sensor having a plurality of first electrodes and second electrodes disposed side by side in a first direction and in a second direction, and the display unit being overlapped in a plan view and a curved area having a curved edge at least at a part thereof. A plurality of first electrodes disposed side by side in a first direction are connected to each other. A plurality of second electrodes disposed side by side in the second direction are connected to each other. In the curved area, distances between the plurality of first electrodes and the second electrodes in the first direction gradually change in the second direction.

BRIEF DESCRIPTION OF THE DRAWINGS

FIG. 6A is a schematic plan view of a display device according to a second embodiment;

FIG. 6B is a schematic plan view of the display device according to the second embodiment;

DETAILED DESCRIPTION OF THE INVENTION

Figure 1B:
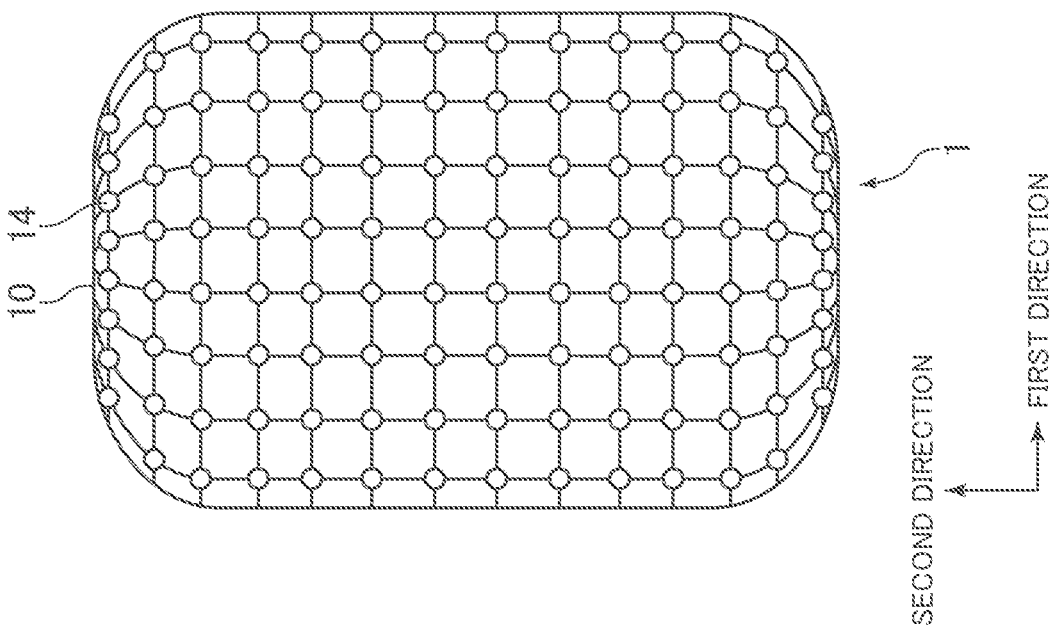
FIG. 1B is a schematic plan view of the display device according to the first embodiment.

Hereinafter, each embodiment of the invention will be described with reference to the drawings. Noted that the disclosure is merely an example, and those skilled in art can easily think of appropriate modifications while keeping the gist of the invention, and a it is needless to say that the modifications are included in the scope of the invention. Further, in order to make the description clearer, there is a case where the width, thickness, shape, and the like of each part are schematically represented as compared with the embodiments, but these are merely an example, and the interpretation of the invention is not limited thereto. In the specification and each drawing, the same elements as those described above with reference to the drawings already described will be given the same reference numerals, and the detailed description thereof will be appropriately omitted.

Furthermore, in the detailed description of the present invention, when defining the positional relationship between a certain configuration element and another configuration element, the terms "above" and "below" mean not only a case of being positioned immediately above or below the configuration element but also a case where another configuration element is further interposed therebetween unless otherwise specified.

First Embodiment

Figure 1A:
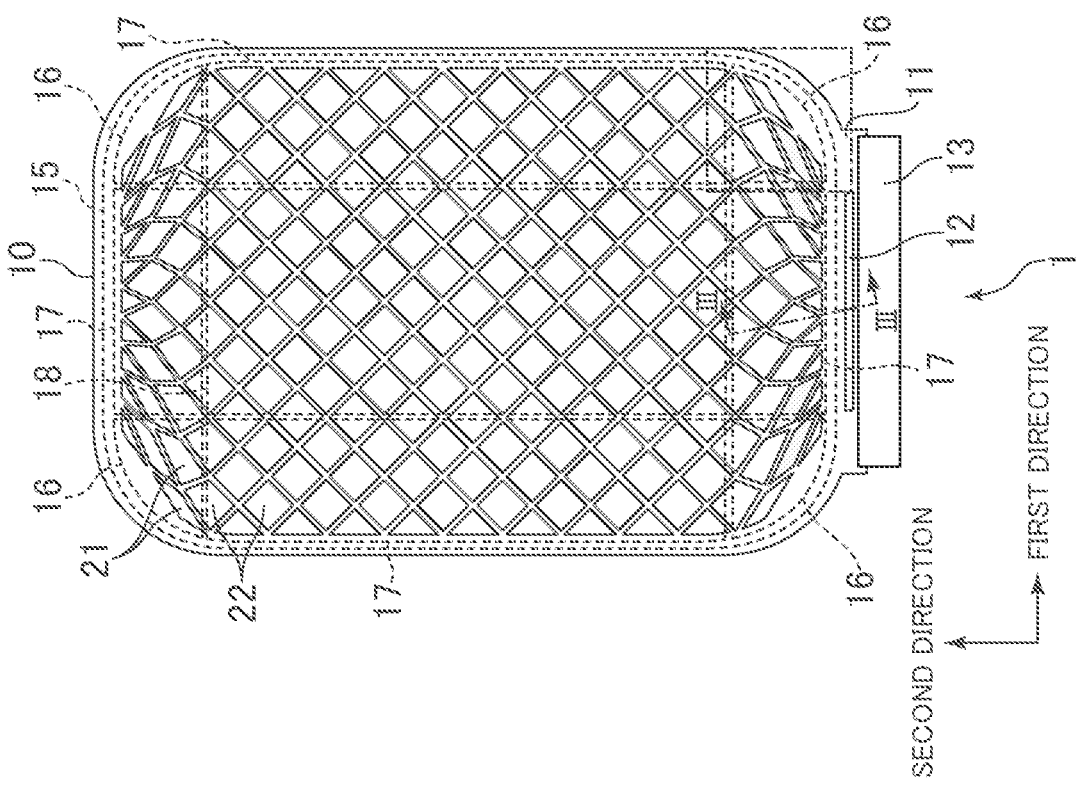
FIG. 1A is a schematic plan view of a display device according to a first embodiment.
Figure 2:
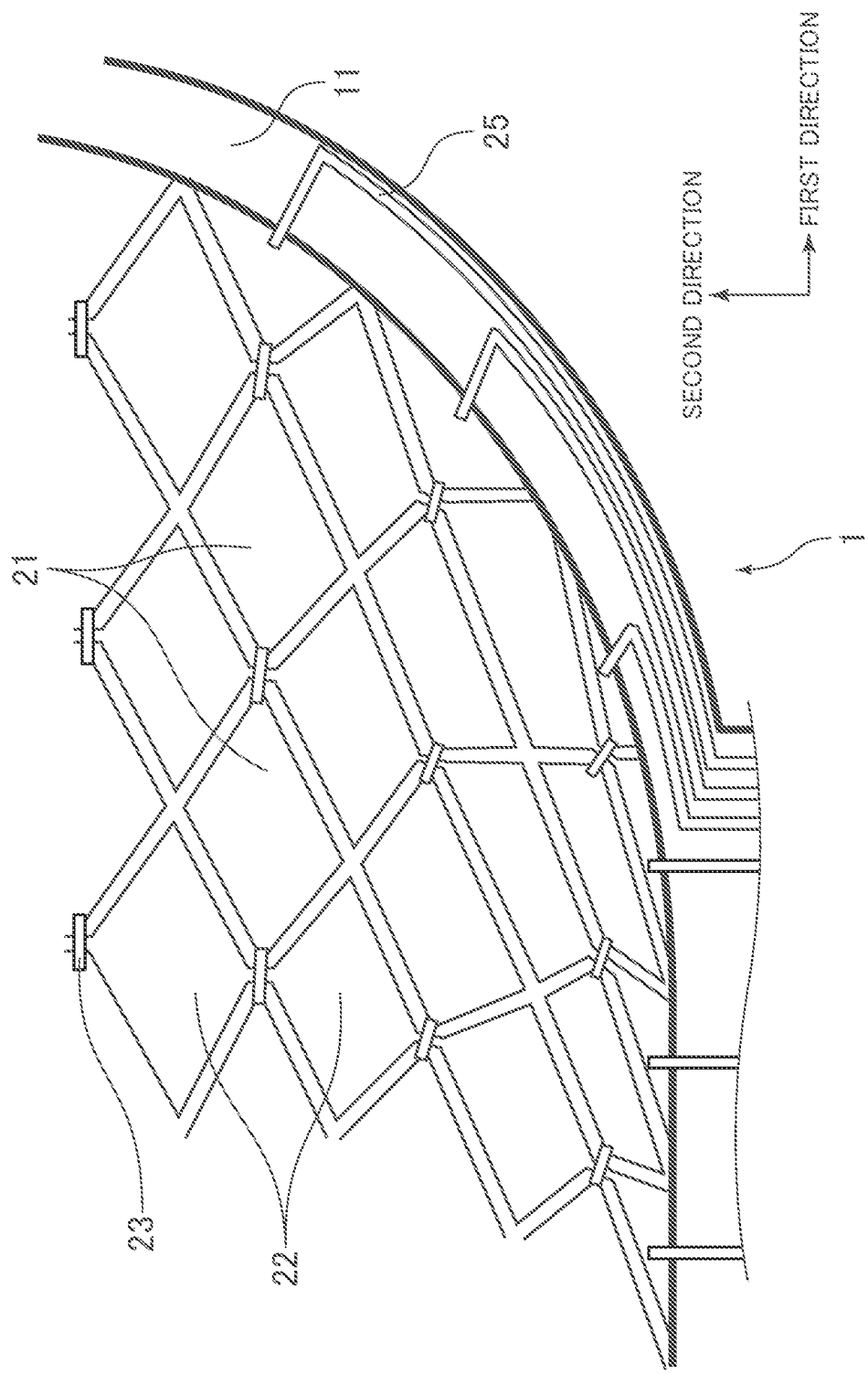
FIG. 2 is an enlarged plan view of the inside of a frame of a one-dot chain line in FIG. 1A.

FIG. 1A is a plan view of a display device 1 according to a first embodiment. FIG. 1B is a view schematically showing a position 14 where a first connection line 23 described later is disposed in an entire touch sensor 20. FIG. 2 is an enlarged view of the inside of a frame of a one-dot chain line shown in FIG. 1A. An organic EL display device is given as an example of the display device 1. The display device 1 includes a full-color pixel by combining unit pixels (sub-pixels) of a plurality of colors including, for example, red, green, and blue, and displays a full-color image.

A periphery area 11 (frame area) is formed outside a display area 15 of a display unit 10. An integrated circuit chip 12 for driving pixels is mounted on the periphery area 11, and an FPC 13 (flexible print board) for electrical connection to the outside is connected thereto. In the following description, the direction along the side of the periphery area 11 to which the FPC 13 is connected is a first direction, and the direction orthogonal thereto is a second direction. The first direction and the second direction may be opposite to each other.

The display device 1 has a curved area 16 having a curved edge at least at a part thereof. Specifically, the display device 1 has a shape obtained by rounding a corner portion having a rectangular shape. The display device 1 has linear edges along the first direction and the second direction, and curved edges or the upper right, lower right, upper left, and lower left, respectively.

The shape of the display device 1 is not limited to the shape shown in FIG. 1A, and may be any other shape as long as the shape includes the curved area 16. For example, the display device 1 may have a shape in which some of the four corners of a rectangle are rounded, or may have a circular shape or an elliptical shape.

In the following description, as shown in FIG. 1A, the rectangular area adjacent to the curved area 16 in the first direction and in the second direction is referred to as a first area 17. A rectangular area adjacent to the first area 17 in the second direction is referred to as a second area 18. The first area 17 and the second area 18 may not be included in the display device 1 depending on the shape of the display device 1.

The curved area 16 is an area surrounded by a first side that linearly extends in the first direction, a second side that linearly extends in the second direction, and a curved side. Specifically, the curved area 16 includes a curved side along the curved edge, and a first side that linearly extends in the first direction and a second side that linearly extends in the second direction from a boundary between the curved edge and a straight edge. In other words, the first side is a boundary line between the curved area 16 and the first area 17 adjacent to the curved area 16 in the second direction. The second side is a boundary line between the curved area 16 and the second area 18 adjacent to the curved area 16 in the first direction. In FIG. 1A, in order to clarify the area, it is described that there is a gap between the curved area 16, the first area 17, and the second area 18, but in reality, two areas adjacent to each other are in contact with each other.

The display device 1 includes the display unit 10 and the touch sensor 20 that is formed to overlap the display unit 10 in a plan view. Specifically, in the display unit 10, a plurality of pixels including a light emitting element and a transistor are disposed in a matrix shape. The display unit 10 displays an image when a plurality of pixels emit light. The touch sensor 20 has a plurality of first electrodes 21 and second electrodes 22 disposed side by side in the first direction and in the second direction, respectively, and overlaps the display unit 10 in a plan view. In the touch sensor 20, an area that overlaps the display unit 10 in a plan view is a touch detection area.

The touch detection area is an area where the coordinates touched by the user or the like are detected. Specifically, the touch detection area has a curved area 16 having a shape inscribed in a rectangle and having a curved edge, at least at a part thereof. For example, the touch detection area of a touch sensor or a display device having a touch sensor of the related art has a rectangular shape, but the touch detection area of the invention has a shape in which four corners of the rectangular shape are rounded. In the touch detection area, the plurality of first electrodes and second electrodes disposed side by side in the first direction and in the second direction are disposed.

Figure 4A:
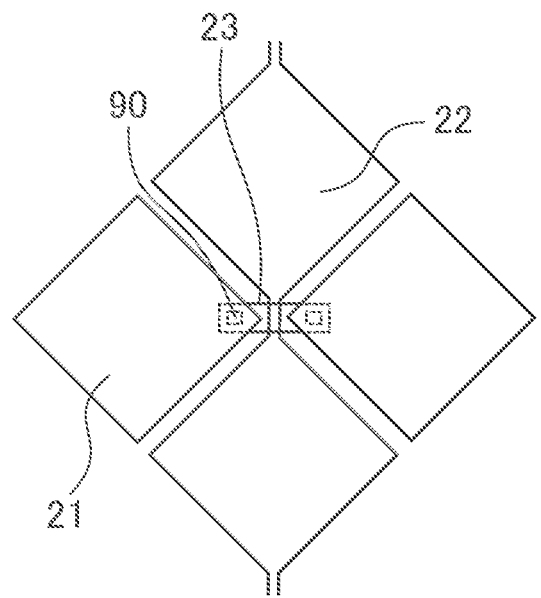
FIG. 4A is an enlarged sectional view of a first electrode and a second electrode.
Figure 4B:
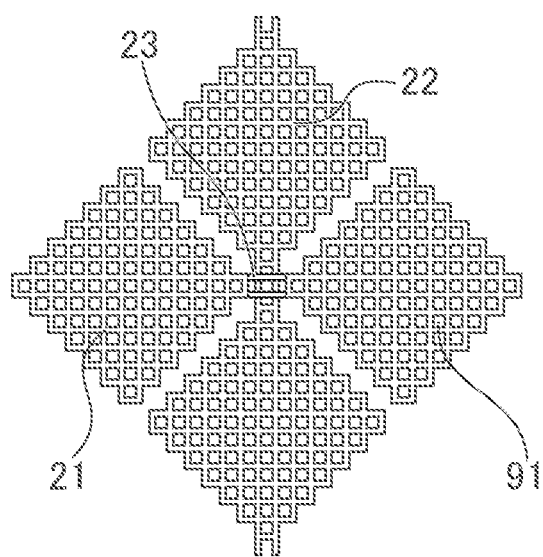
FIG. 4B is an enlarged sectional view of the first electrode and the second electrode.

As shown in FIG. 1A, each of the first electrode 21 and the second electrode 22 is formed in a rectangular shape having a first direction and a second direction intersecting the first direction as diagonal directions (refer to FIGS. 4A and 4B). In addition, a part of the first electrode 21 and the second electrode 22 which are in contact with the edge of the display device 1 is formed in a triangular shape.

The plurality of first electrodes 21 disposed side by side in the first direction are connected to each other. Specifically, as shown in FIGS. 1A and 2, the plurality of first electrodes 21 are two-dimensionally arranged side by side in the first direction and in the second direction, respectively. Among these first electrodes 21, the first electrodes 21 adjacent to each other in the first direction are connected to each other via the first connection line 23, and the first electrodes 21 adjacent to each other in the second direction are not connected to each other. 1n other words, the plurality of first electrodes 21 respectively form a plurality of electrode rows that extend in the first direction by connecting the first electrodes 21 adjacent to each other in the first direction via the first connection line 23, each electrode row is electrically separated from each other in the second direction.

The plurality of second electrodes 22 disposed side by side in the second direction are connected to each other. Specifically, the plurality of second electrodes 22 are two-dimensionally arranged side by side in the first direction and in the second direction, respectively. Among these second electrodes 22, the second electrodes 22 adjacent to each other in the second direction are connected to each other via a second connection line 24 intersecting the first connection line 23 in a plan view, and the second electrodes 22 adjacent to each other in the first direction are not connected to each other. In other words, the plurality of second electrodes 22 form a plurality of electrode rows that extend in the second direction by connecting the second electrodes 22 adjacent to each other in the second direction via the second connection line 24, each electrode row is electrically separated from each other in the first direction. The first connection line 23 is provided on the upper layer of the connected second electrodes 22, but may be provided on the lower layer.

Each second electrode 22 is disposed so as to be surrounded by the first electrode 21 in a plan view. For example, each of the second electrodes 22 is disposed between the first electrodes 21 adjacent to each other in a direction (for example, a direction of 45 degrees or −45 degrees) intersecting both the first direction and the second direction, and is surrounded by four first electrodes 21. The first electrode 21 and the second electrode 22 are electrically separated from each other by leaving a distance so as not to come into contact with each other.

In the curved area 16 and the first area 17, the distances between the plurality of first electrodes 21 and the second electrodes 22 in the first direction gradually change in the second direction. Specifically, as shown in FIG. 1B, in the curved area 16 on the side where the FPC 13 of the display device 1 is provided (lower side of FIG. 1B), the distances between the connection lines 23 aligned in the first direction (left-right direction of FIG. 1B) gradually increase as going in the second direction (upward direction of FIG. 1B). Therefore, in the curved area 16 on the side where the FPC 13 of the display device 1 is provided, the distances between the plurality of first electrodes 21 and the second electrodes 22 in the first direction gradually increase in the second direction. Therefore, in the first area 17 adjacent to the curved area 16 in the first direction on the side where the FPC 13 of the display device 1 is provided, the distances between the plurality of first electrodes 21 and the second electrodes 22 in the first direction gradually increase in the second direction.

In the curved area 16 on the side (upper side of FIG. 1B) opposite to the side where the FPC 13 of the display device 1 is provided, the distances between the connection lines 23 aligned in the first direction (left-right direction of FIG. 1B) gradually decrease as going in the second direction (upward direction of FIG. 1B). Therefore, in the first area 17 adjacent to the curved area 16 in the first direction on the side opposite to the side where the FPC 13 of the display device 1 is provided, the distances between the plurality of first electrodes 21 and the second electrodes 22 in the first direction gradually decrease in the second direction.

Meanwhile, the distances between the plurality of first electrodes 21 and the second electrodes 22 in the second direction are constant. Specifically, as shown in FIG. 1B, in any area (the curved area 16, the first area 17, and the second area 18) of the touch sensor 20, the distances between the connection lines 23 aligned in the second direction (up-down direction of FIG. 1B) are constant. Therefore, in all areas of the touch sensor 20, the distances between the plurality of first electrodes 21 and the second electrodes 22 in the second direction are constant.

Figure 3:
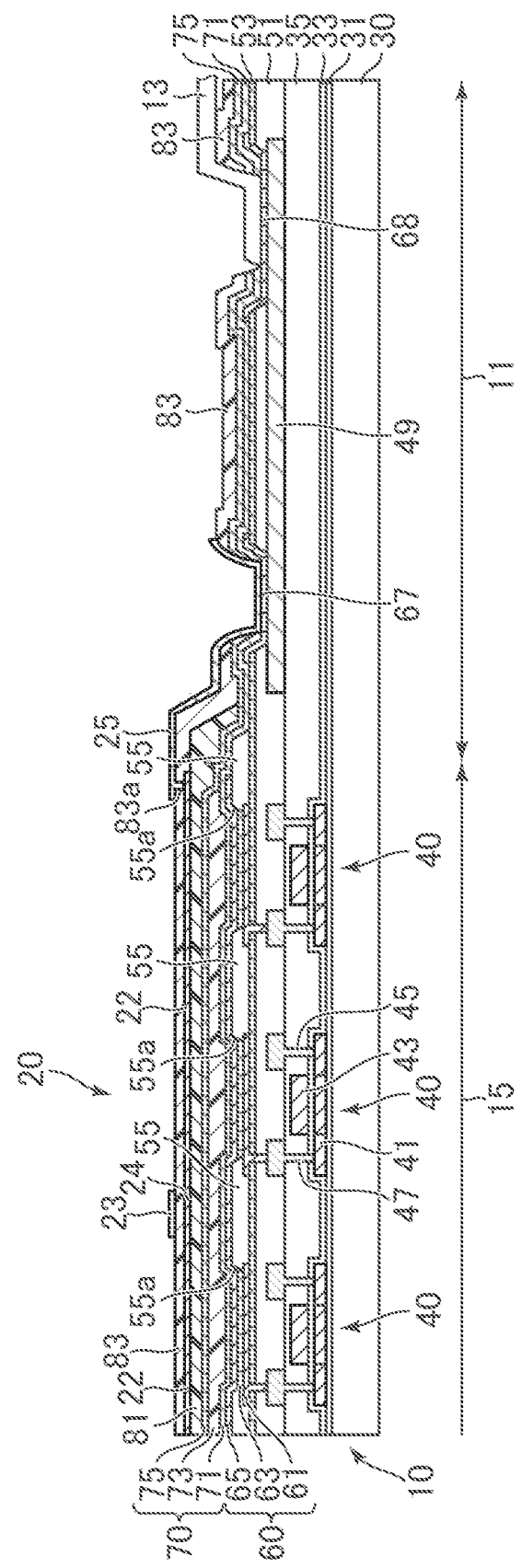
FIG. 3 is a schematic sectional view showing a section taken along line III-III line in FIG. 1A.

FIG. 3 shows a sectional view when cut along line III-III shown in FIG. 1A. In FIG. 3, hatching of some layers such as a substrate 30, a flattening film 51, and a pixel separation film 55 is omitted in order to make it easy to see the sectional structure. Further, the description of the integrated circuit chip 12 is omitted. In the following description regarding FIG. 3, the laminating direction is the upward direction.

The substrate 30 is made of, for example, glass or a flexible resin such as polyimide. The substrate 30 is covered with an undercoat layer 31. A semiconductor layer 41 is formed on the undercoat layer 31, and the semiconductor layer 41 is covered with a gate insulating film 33. A gate electrode 43 is formed on the gate insulating film 33, and the gate electrode 43 is covered with a passivation film 35. A drain electrode 45 and a source electrode 47 penetrate the gate insulating film 33 and the passivation film 35 and are connected to the semiconductor layer 41. The semiconductor layer 41, the gate electrode 43, the drain electrode 45, and the source electrode 47 form a thin film transistor 40. The thin film transistor 40 is provided so as to correspond to each of the plurality of unit pixels. The undercoat layer 31, the gate insulating film 33, and the passivation film 35 are formed of, for example, an inorganic insulating material such as SiO2, SiN, or SiON, and may have a laminated structure having a plurality of layers in addition to the single layer including the above-described inorganic insulating material. The undercoat layer 31 may include a resin layer in a layer that is not in contact with the substrate 30 and the semiconductor layer 41.

On the passivation film 35, in addition to the drain electrode 45 and the source electrode 47, a wiring 49 is formed on the periphery area 11. The illustrated wiring 49 is a wiring for electrically connecting the touch sensor 20 and the FPC 13 to each other. The drain electrode 45, the source electrode 47, and the wiring 49 are covered with the flattening film 51, and the flattening film 51 is covered with an inorganic insulating film 53. The drain electrode 45, the source electrode 47, and the wiring 49 are formed of a conductive material containing, for example, Al, Ag, Cu, Ni, Ti, and Mo. The flattening film 51 is formed of an organic insulating material such as acrylic resin and has a flat upper surface. The inorganic insulating film 53 is formed of an inorganic insulating material such as SiO2, SiN, or SiON.

A pixel electrode 61 (for example, an anode) is formed on the inorganic insulating film 53. The pixel electrode E penetrates the flattening film 51 and the inorganic insulating film 53 and is connected to the source electrode 47. The pixel electrode 61 is provided so as to correspond to each of the plurality of unit pixels. The pixel electrode 61 is formed as a reflective electrode. Further, in the periphery area 11, a first terminal. 7 and a second terminal 68 exposed from the inorganic insulating film 53 and the like are formed on the upper surface of the substrate 30, penetrate the flattening film 51 and the inorganic insulating film 53, and are respectively connected to both end portions of the wiring 4. The second terminal 68 is disposed at a position farther from the display area 15 than the first terminal 67. In other words, the second terminal 68 is disposed at a position farther from a light emitting element 60 which will be described later than the first terminal 67.

The pixel electrode 61, the first terminal 67, and the second terminal 68 are formed by including a conductive material containing, for example, Al, Ag, Cu, Ni, Ti, and Mo. Further, since the first terminal. 67 and the second terminal 68 are often exposed to the atmosphere during the process, a material that hardly causes surface oxidation or the like, for example, an indium-based oxide such as ITO or IZO may be included. In other words, the first terminal 67 and the second terminal 68 may have a two-layer structure of a conductive material containing Al, Ag, Cu, Ni, Ti, and Mo, and an indium-based oxide that hardly causes surface oxidation and the like.

In a case where the first terminal 67 and the second terminal 6 include indium-based oxide on the surface side thereof, when a first inorganic insulating film 71, a second inorganic insulating film 75, an interlayer insulating film 83 and the like are etched and removed, the indium-based oxide has a small selection ratio with respect to the etching solution, and thus, it is desirable that the shapes of the first terminal 67 and the second terminal 68 can be maintained.

Further, in a case where the display device 1 is the bottom emission type, the pixel electrode 61 needs to be formed as a transmissive electrode, and in this case, the above-described indium-based oxide can be used.

The pixel separation film 55 is disposed around the pixel electrode 61. The pixel separation film 55 is also called a rib or a bank. On the pixel separation film 55, a first opening 55a is formed such that the pixel electrode 61 is exposed at the bottom. An inner edge part of the pixel separation film 55 that forms the first opening 55a is placed at a circumferential edge part of the pixel electrode 61, and has a tapered shape that becomes wider outward in the upward direction. The pixel separation film 55 is formed in the display area 15 and in the vicinity of the boundary between the periphery area 11 and the display area 15. The pixel separation film 55 is formed of an organic insulating material such as acrylic resin.

On the pixel electrode 61 exposed at the bottom of the first opening 55a of the pixel separation film 55, a light emitting layers 63 are formed separately from each other. The light emitting layer 63 emits light in a plurality of colors of, for example, red, green, and blue corresponding to each of the plurality of unit pixels. At least one of a positive hole transport layer, a positive hole injection layer, an electron transport layer, and an electron injection layer may be formed together with the light emitting layer 63. The light emitting layer 63 is individually formed by vapor deposition using a mask. The light emitting layer 63 may be formed by vapor deposition as a uniform film in the entire display area 15. In this case, the light emitting layer 63 emits light of a single color (for example, white), and each component of a plurality of colors of red, green, and blue is extracted by a color filter 103 or a color conversion layer. The light emitting layer 63 is not limited to the formation by vapor deposition and may be formed by coating.

The light emitting layer 63 and the pixel separation film 55 are covered with a counter electrode 65 (for example, cathode). The counter electrode 65 is formed as a uniform film in the entire display area 15. The light emitting element 60 is configured with the light emitting layer 63 and the pixel electrode 61 and the counter electrode 65 sandwiching the light emitting layer 63, and the light emitting layer 63 emits light by a current that flows between the pixel electrode 61 and the counter electrode 65. The counter electrode 65 is formed of a transparent conductive material such as ITO or a metal thin film such as MgAg. In a case where the display device 1 is a top emission type, the counter electrode 65 needs to be formed as a transmissive electrode, and in a case where a metal thin film is used, it is necessary to reduce the film thickness to the extent that light is transmitted.

The pixel separation film 55 and the counter electrode 65 are sealed by being covered with a sealing film (passivation film) 70, and are shielded from moisture. The sealing film 70 has a three-layer laminated structure including, for example, the first inorganic insulating film 71, the organic insulating film 73, and the second inorganic insulating film 75 in this order from the bottom. The first inorganic insulating film 71 and the second inorganic insulating film 75 are formed of an inorganic insulating material such as SiO2, SiN, or SiON. The organic insulating film 73 is formed of an organic insulating material such as acrylic resin, and flattens the top surface of the sealing film 70. The display unit 10 is configured of each layer of the substrate 30 to the sealing film 70.

The display device 1 has the touch sensor 20 on the sealing film 70. Specifically, a protective insulating film 81 is formed on the sealing film 70, and the plurality of first electrodes 21 and the plurality of second electrodes 22 that are two-dimensionally arranged are formed on the protective insulating film 81. An interlayer insulating film 83 is formed on the first electrode 21 and the second electrode 2t. The first electrode 21 and the second electrode 22 configure a drive electrode and a detection electrode of the electrostatic capacity type touch sensor 20. The protective insulating film 81 and the interlayer insulating film 83 are formed of an organic insulating material such as acrylic resin. The protective insulating film 81 may be omitted, and in this case, the first electrode 21 and the second electrode 22 are formed on the sealing film 70.

In the present embodiment, the first electrode 21 and the second electrode 22 have a laminated structure including a first layer containing a material such as Ag or MoW that makes ohmic contact with the indium-based material and second layer provided on the first layer and containing indium-based oxide such as ITO, IZO, and IGZO.

In the present embodiment, the plurality of first electrodes 21 and the plurality of second electrodes 22 are disposed in the same layer between the sealing film 70 and the interlayer insulating film 83, but the present invention is not limited thereto, and the plurality of first electrodes 21 and the plurality of second electrodes 22 may be disposed on layers different from each other. In other words, one of the first electrode 21 and the second electrode 22 may be disposed below the interlayer insulating film 83, and the other may be disposed above the interlayer insulating film 83. Further, both the first electrode 21 and the second electrode 22 may be disposed on the interlayer insulating film 83.

As shown in FIGS. 2 to 4B, the first connection line 23 and the second connection line 24 intersect each other in a plan view. The interlayer insulating film 83 is interposed between the first connection line 23 and the second connection line 24 that intersect each other in a plan view, and both the first connection line 23 and the second connection line 24 are electrically separated from each other.

The first connection line 23 is a so-called bridge wiring disposed on the interlayer insulating film 83. Specifically, as shown in FIGS. 3 and 4A, the first connection line 23 is connected to the first electrode 21 through a through hole 90 formed in the interlayer insulating film 83. Meanwhile, the second connection line 24 is formed continuously with the second electrode 22 under the interlayer insulating film 83. Note that FIG. 4A is an enlarged view of the first electrode 21 and the second electrode 22 in the second area 18 of FIG. 1A.

The first connection line 23 is formed of a conductive material containing, for example, Al, Ag, Cu, Ni, Ti, and Mo. The first connection line 23 may have, for example, a three-layer structure of Ti, Al, and Ti, or may have a three-layer structure of Mo, Al, and Mo. By forming the first connection line 23 with such a laminated structure, it is possible to achieve low resistance of the first connection line 23 and suppress the occurrence of delay caused by time constant in the detection in the touch sensor 20. The second connection line 24 has a laminated structure including a first layer containing a material such as Ag or Mow that makes ohmic contact with the indium-based material and a second layer provided on the first layer and containing indium-based oxide such as ITO, IZO and IGZO.

The first electrode 21 and the second electrode 22 may be rectangular electrodes having a uniform thickness, or may have a shape having a third opening 91 in an area that emits light from a plurality of pixels. Specifically, as shown in FIG. 4A, each of the plurality of first electrodes 23 and the plurality of second electrodes 22 may be formed in a rectangular uniform thickness. Further, as shown in FIG. 4B, the plurality of first electrodes and the second electrodes 22 may each be formed in a mesh shape having the plurality of third openings 91. Each third opening 91 is formed at a position overlapping the area (that is, the first opening 55a) that emits light of a plurality of pixels in a plan view. Accordingly, reflection, absorption, and the like of light emitted by the pixel due to the first electrode 21 and the second electrode 22 can be reduced, and the brightness of the display device 1 can be improved.

Further, the second connection line 24 may be disposed as a bridge wiring on the interlayer insulating film 3, and the first connection line 23 may be formed continuously with the first electrode 21 under the interlayer insulating film 83. Further, an intersection unit where the first connection line 23 intersects the second connection line 24 as a bridge wiring and an intersection unit where the second connection line 24 intersects the first connection line 23 as a bridge wiring may be mixed.

A lead wire 25 is disposed on the interlayer insulating film 83 from the circumferential edge portion of the display area 15 to the periphery area 11. Specifically, the lead wire 25 has, for example, a three-layer structure of Ti, Al, and Ti, or Mo, Al, and Mo. The lead wire 25 is connected to the first electrode 21 or the second electrode 22 through a second opening 83a formed on the interlayer insulating film 83. The lead wire 25 is formed over the end surface of the first inorganic insulating film 71, the second inorganic insulating film 75, and the interlayer insulating film 83, and is connected to the exposed upper surface of the first terminal 67. The lead wire 25 is connected to the wiring 49 disposed below the light emitting element 60 via the first terminal 67.

The FPC 13 is connected to the second terminal 68 disposed on the side separated from the display area 15. In the periphery area 11, a terminal (third terminal) (not shown) is also provided. The terminal is electrically connected to the light emitting element 60, and the FPC 13 is connected to this terminal (not shown). The terminal (not shown is electrically connected to the light emitting element 60 via the thin film transistor 40 and the integrated circuit chip 12.

Furthermore, the FPC 13 is connected to both the second terminal 60 electrically connected to the touch sensor 20 and a terminal (third terminal) (not shown) electrically connected to the light emitting element 60. Therefore, a single FPC 13 can supply signals to both the touch sensor 20 and the light emitting element 60 from the outside.

Figure 5:
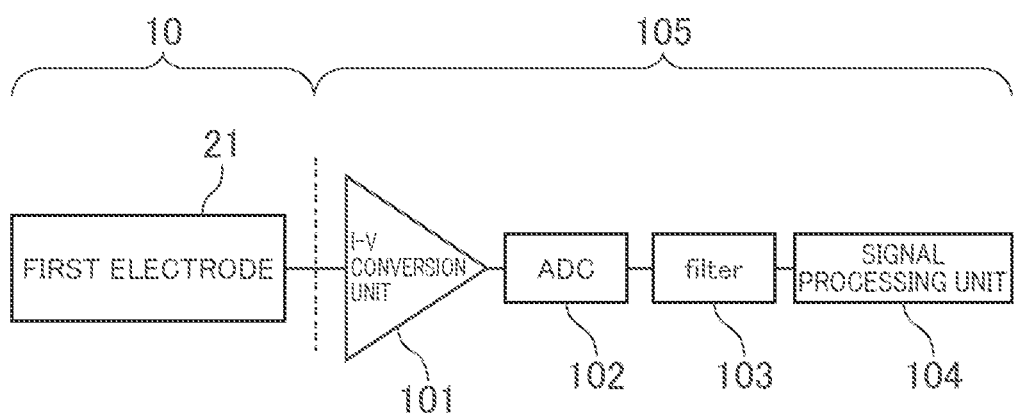
FIG. 5 is a view showing a functional configuration of a control unit.

Next, an example of a control unit 105 that calculates the touched position on the touch sensor 20 will be described. FIG. 5 is a view showing a functional configuration of the control unit 105. The control unit 105 includes an I-V conversion unit 101, an analog-digital conversion unit 102 (ADC), a filter 103, and a signal processing unit 104.

The I-V conversion unit 101 converts the amount of change in the current value, which appears depending on whether or not the first electrode 21 is touched, into the amount of change in the voltage value. Specifically, the I-V conversion unit 101 is electrically connected to the first electrode 21 via the lead wire 25. Further, the second electrode 22 is electrically connected to the voltage application unit 110 (not shown) via the lead wire 25. For example, a pulse signal is input to the second electrode 22 by the voltage application unit 110. The voltage of the first electrode 21 changes via the electrostatic capacity formed between the first electrode 21 and the second electrode 22. At this time, charges move between the first touch electrode and the I-V conversion unit 101. In other words, a current flows from a first touch electrode to the I-V conversion unit 20. This current value differs depending on whether or not the first electrode 21 is touched. The I-V conversion unit 101 converts the current supplied from the first touch electrode into a voltage. The first electrode 21 and the second electrode 22 may be exchangeable, the first electrode 21 may be connected to the voltage application unit 110, and the second electrode 22 may be connected to the I-V conversion unit 101.

The analog-digital conversion unit 102 converts the analog voltage value converted by the I-V conversion unit 101 into a digital voltage value.

The filter 103 measures the voltage converted to digital a predetermined number of times and averages the voltages. Specifically, for example, the filter 103 performs processing of averaging the voltage values measured four times per second. The filter 103 may perform processing of excluding the maximum value and the minimum value from the voltage values measured a predetermined number of times and averaging the other voltage values.

The filter 103 may be provided between the I-V conversion unit 202 and the first electrode 21, or between the I-V conversion unit 101 and the analog-digital conversion unit 102. In this case, the filter 103 may be configured by a low pass filter 103, a band pass filter 103, or the like.

The signal processing unit 104 calculates the touched coordinates of the touch sensor 20 based on the voltage value output by the filter 103. Specifically, based on the relationship between the position of the plurality of first electrodes 21 and the voltage value calculated from the output of each first electrode 21, the signal processing unit 104 calculates a function that approximates the relationship between the position and the voltage value. The signal processing unit 104 calculates the touched coordinate in the second direction according to the peak value of the function. Further, based on the relationship between the position of the second electrode 22 into which the pulse signal is input and the voltage value calculated from the output of each first electrode 21, the signal processing unit 104 calculates a function that approximates the relationship between the position and the voltage value. The signal processing unit 104 calculates the touched coordinate in the first direction according to the peak value of the function.

The control unit 105 is included in an IC (not shown) disposed on the FPC 13. Further, the control unit 105 may be included in the integrated circuit chip for driving the pixel.

As described above, in the first embodiment, in the curved area 16 and the first area 17, the first electrode 21 and the second electrode 22 disposed at the same coordinates in the second direction are formed in the first direction at constant distances. Therefore, unlike the related art, only the electrodes disposed along the edge of the display device 1 do not have a unique shape. Therefore, when the signal processing unit 104 calculates the touched coordinates, the influence of the first electrode 21 and the second electrode 22 having a unique shape can be averaged in the first direction. Accordingly, the calculation accuracy of the coordinates in the first direction can be improved.

Second Embodiment

Subsequently, a second embodiment of the present invention will be described. The description of the same configuration as those of the first embodiment will be omitted. FIG. 6A is a plan View of the display device 1 according to the second embodiment of the present invention. FIG. 6B is a view schematically showing a position where the connection line 23 is disposed in the entire touch sensor 20.

In the second embodiment, in the first area 17 and the second area 18, the distances between the plurality of first electrodes 21 and the second electrodes 22 in the first direction and in the second direction are constant. In other words, the first electrode 21 and the second electrode 22 disposed in the area other than the curved area 16 are both formed in the same rhombus shape. In addition, a part of the first electrode 21 and the second electrode 22 disposed to be in contact with the edge if the display device 1 of the first area 17 is formed in a triangular shape.

Meanwhile, in the curved area 16, the distances between the plurality of first electrodes 21 and the second electrodes 22 in the first direction gradually change in the Second direction. Specifically, as shown in FIG. 6B, in the curved area 16 on the side (lower side of FIG. 6B) where the FPC 13 of the display device 1 is provided, the distances between the connection lines 23 aligned in the first direction (left-right direction of FIG. 6B) gradually increase as going in the second direction (upward direction of FIG. 6B). Therefore, in the curved area 16, the distance between the plurality of first electrodes 21 and the second electrodes 22 in the first direction gradually increase in the second direction.

In the curved area 16 on the side (upper side of FIG. 6B) opposite to the side where the FPC 13 of the display device 1 is provided, the distances between the connection lines 23 aligned in the first direction (left-right direction of FIG. 6B) gradually decrease as going in the second direction (upward direction of FIG. 6B).

Further, in the curve area 16, the distances between the plurality of first electrode 21 and the second electrodes 22 in the second direction gradually charge in the first direction. Specifically, as shown in FIG. 6B, in the curved area 16 on the left side of FIG. 6B, the distances between the connection lines 23 aligned in the second direction (up-down direction of FIG. 6B) gradually increase as going in the first direction (rightward direction of FIG. 6B). Therefore, in the curved area 16, the distances between the plurality of first electrodes 21 and the second electrodes 22 in the second direction gradually increase in the first direction.

In the curved area 16 on the right side of FIG. 6B, the distances between the connection lines 23 aligned in the second direction (up-down direction of FIG. 6B), gradually decrease as going in the first direction (rightward direction of FIG. 6B). Therefore, in the curved area 16, the distances between the plurality of first electrodes 21 and the second electrodes 22 in the second direction gradually decrease in the first direction.

As described above, in the second embodiment, the first electrode 21 and the second electrode 22 are disposed at constant distances in the first direction and in the second direction in the area other than the curved area 16. Accordingly, the detection accuracy in the curved area 16 can be improved in the same manner as in the first embodiment while maintaining the coordinate detection accuracy similar to that in the technique of the related art in the area other than the curved area 16.

Third Embodiment

Figure 7A:
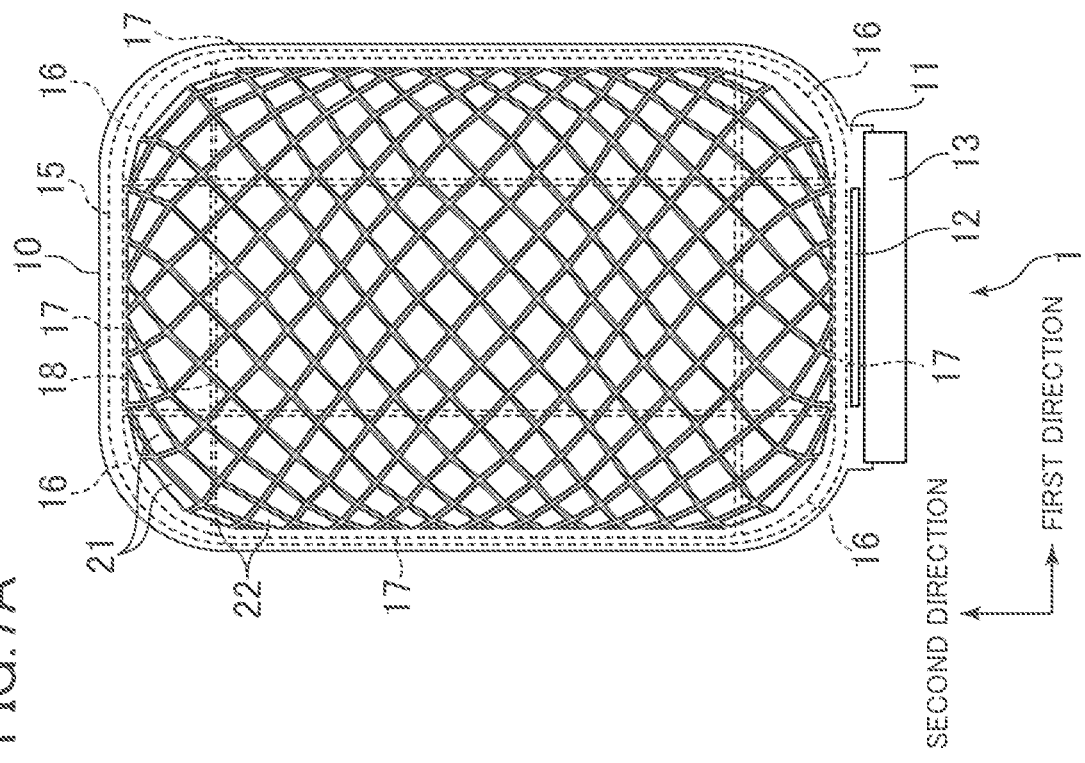
FIG. 7A is a schematic plan view of a display device according to a third embodiment.
Figure 7B:
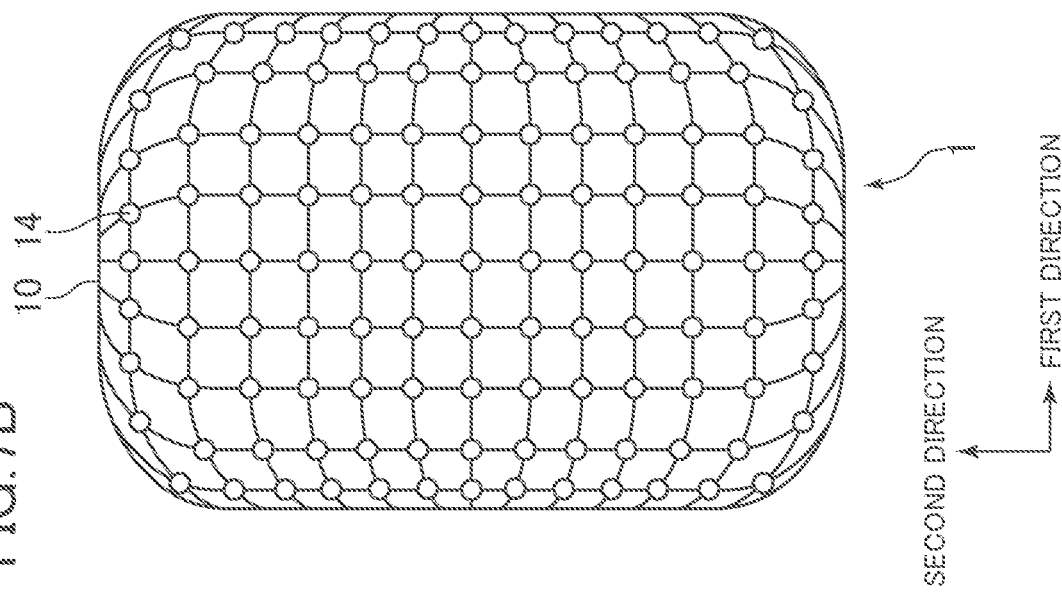
FIG. 7B is a schematic plan view of the display device according to the third embodiment.
Figure 8:
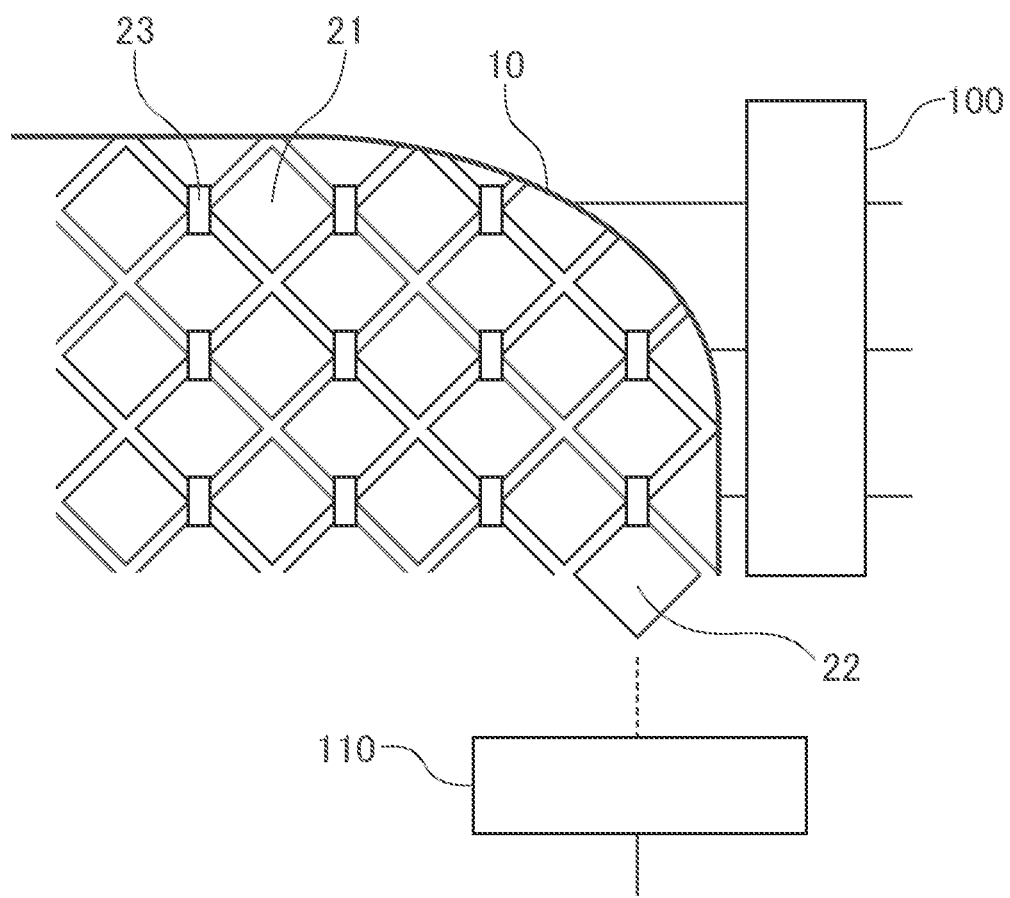
FIG. 8 is a schematic plan view of a display device according to the related art.

Subsequently, a third embodiment of the present invention will be described. The description of the same configuration as those of the first embodiment will be omitted. FIG. 7A is a plan view of the display device 1 according to the third embodiment of the present invention. FIG. 7B is a view schematically showing a position where the connection line 23 is disposed in the entire touch sensor 20.

In the third embodiment, in the curved area 16, the first area 17, and the second area 18, the distances between the plurality of first electrodes 21 and the second electrodes 22 in the first direction gradually change in the second direction, and the distances between the plurality of first electrodes 21 and the second electrodes 22 in the second direction gradually change in the first direction.

Specifically, as shown in FIG. 7B, in an area below the center of the display device 1, the distances between the connection lines 23 aligned in the first direction (left-right direction of FIG. 7B) gradually increase as going in the second direction (upward direction of FIG. 7B). Therefore, in an area below the center of the display device 1, the distances between the plurality of first electrodes 21 and the second electrodes 22 in the first direction gradually increase in the second direction.

In an area above the center of the display device 1, the distances between the connection lines 23 aligned in the first direction (left-right direction of FIG. 7B) gradually decrease as going in the second direction (upward direction of FIG. 7B). Therefore, in an area above the center of the display device 1, the distances between the plurality of first electrodes 21 and the second electrodes 22 in the first direction gradually decrease in the second direction.

In an area on the left of the center of the display device 1, the distances between the connection lines 23 aligned in the second direction (up-down direction of FIG. 7B) gradually increase as going in the first direction (rightward direction of FIG. 7B). Therefore, in an area on the left of the center of the display device 1, the distances between the plurality of first electrodes 21 and the second electrodes 22 in the second direction gradually increase in the first direction.

In an area on the right of the center of the display device 2, the distance between the connection lines 23 aligned in the second direction (up-down direction of FIG. 7B) gradually decrease as going n the first direction (rightward direction of FIG. 7B). Therefore, in an area on the right of the center of the display device 1, the distances between the plurality of first electrodes 21 and the second electrodes 22 in the second direction gradually decrease in the first direction.

As described above, in the third embodiment, in the entire area of the display device 1, the distances between the first electrode 21 and the second electrode 22 gradually change respectively in the first direction and in the second direction. Accordingly, the influence of the curved edge of the display device 1 is dispersed over the entire display device 1, and thus the detection accuracy of the touched coordinate can be improved.

In each of the above-described embodiments, a case of an organic EL display device is illustrated as a disclosure example, but as another application example, any flat panel type display device 1 such as a liquid crystal display device, another self-luminous display device, or an electron paper type display device including an electrophoretic element or the like, can be used. It is needless to say that the present invention can be applied to small, medium, and large sizes without any particular limitation.

Further, in the above-described embodiments, an example in which the display device integrally is formed with the touch sensor 20 so as to be superimposed on the display area has been described as an example, but it is needless to say that the invention can also be applied to the touch sensor 20 alone, that is, the touch panel device itself.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A touch sensor comprising:
a touch detection area having a first area and a curved area having a curved edge, the curved area adjacent to the first area, wherein
in the touch detection area, a plurality of first electrodes and second electrodes are disposed,
the plurality of first electrodes are disposed side by side in a first direction and connected to each other by a first connection line which is at a different layer as the plurality of first electrodes and the second electrodes,
the plurality of second electrodes are disposed side by side in a second direction and connected to each other,
in the curved area, distances between the plurality of first electrodes and the second electrodes in the first direction gradually change in the second direction, and
an extending direction of the first connection line in the curved area is different from the extending direction of the first connection line in the first area.

2. The touch sensor according to claim 1, wherein the curved area is an area surrounded by a first side that linearly extends in the first direction, a second side that linearly extends in the second direction, and a curved side.

3. The touch sensor according to claim 1, wherein in the curved area, the distances between the plurality of first electrodes and the second electrodes in the second direction are constant.

4. The touch sensor according to claim 3, wherein in the first area adjacent to the curved area in the first direction, the distances between the plurality of first electrodes and the second electrodes in the first direction gradually change in the second direction, and in the first area, the distances between the plurality of first electrodes and the second electrodes in the second direction are constant.

5. The touch sensor according to claim 1, wherein in the curved area, the distances between the plurality of first electrodes and the second electrodes in the second direction gradually change in the first direction.

6. The touch sensor according to claim 5, wherein in the first area adjacent to the curved area in the first direction, the distances between the plurality of first electrodes and the second electrodes in the first direction and in the second direction are constant.

7. The touch sensor according to claim 1, wherein in the curved area, in the first area adjacent to the curved area in the first direction, and in a second area adjacent to the first area in the second direction, the distances between the plurality of first electrodes and the second electrodes in the first direction gradually change in the second direction, and in the curved area, in the first area, and in the second area, the distances between the plurality of first electrodes and the second electrodes in the second direction gradually change in the first direction.

8. The touch sensor according to claim 1, wherein a display device includes a control unit that calculates a coordinate touched on the touch sensor based on an output of the first electrode or the second electrode, and the control unit has a filter that measures the output of the first electrode or the second electrode a predetermined number of times and averages the outputs.

9. The touch sensor according to claim 1, wherein the first electrode and the second electrode have an opening in an area that emits light of a plurality of pixels.

10. A display device comprising:
a display unit in which a light emitting element and a plurality of pixels having transistors are disposed in a matrix shape;
a touch sensor having a plurality of first electrodes and second electrodes disposed side by side in a first direction and in a second direction, and the display unit being overlapped in a plan view;
a first area; and
a curved area having a curved edge at least at a part thereof, the curved area adjacent to the first area, wherein
the plurality of first electrodes disposed side by side in the first direction are connected to each other by a first connection line which is at a different layer as the plurality of first electrodes and the second electrodes,
the plurality of second electrodes disposed side by side in the second direction are connected to each other,
in the curved area, distances between the plurality of first electrodes and the second electrodes in the first direction gradually change in the second direction, and
an extending direction of the first connection line in the curved area is different from the extending direction of the first connection line in the first area.

11. The display device according to claim 10, wherein the curved area is an area surrounded by a first side that linearly extends in the first direction, a second side that linearly extends in the second direction, and a curved side.

12. The display device according to claim 10, wherein in the curved area, the distances between the plurality of first electrodes and the second electrodes in the second direction are constant.

13. The display device according to claim 10, wherein in the first area adjacent to the curved area in the first direction, the distances between the plurality of first electrodes and the second electrodes in the first direction gradually change in the second direction, and in the first area, the distances between the plurality of first electrodes and the second electrodes in the second direction are constant.

14. The display device according to claim 10, wherein in the curved area, the distances between the plurality of first electrodes and the second electrodes in the second direction gradually change in the first direction.

15. The display device according to claim 14, wherein in the first area adjacent to the curved area in the first direction, the distances between the plurality of first electrodes and the second electrodes in the first direction and in the second direction are constant.

16. The display device according to claim 14, wherein in the curved area, in the first area adjacent to the curved area in the first direction, and in a second area adjacent to the first area in the second direction, the distances between the plurality of first electrodes and the second electrodes in the first direction gradually change in the second direction, and in the curved area, in the first area, and in the second area, the distances between the plurality of first electrodes and the second electrodes in the second direction gradually change in the first direction.

17. The display device according to claim 10, wherein the display device includes a control unit that calculates a coordinate touched on the touch sensor based on an output of the first electrode or the second electrode, and the control unit has a filter that measures the output of the first electrode or the second electrode a predetermined number of times and averages the outputs.

18. The display device according to claim 10, wherein the first electrode and the second electrode have an opening in an area that emits light of a plurality of pixels.

\* \* \* \* \*